(12) United States Patent
Hong et al.

(10) Patent No.: US 10,515,844 B2
(45) Date of Patent: Dec. 24, 2019

(54) SUBSTRATE SUPPORTING AND TRANSFERRING APPARATUS, METHOD OF SUPPORTING AND TRANSFERRING SUBSTRATE, AND MANUFACTURING METHOD OF DISPLAY APPARATUS USING THE SAME

(71) Applicant: SAMSUNG ELECTRONICS CO., LTD., Suwon-si, Gyeonggi-do (KR)

(72) Inventors: Sang-Joon Hong, Seoul (KR); Sang-Hyun Park, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/044,701

(22) Filed: Jul. 25, 2018

(65) Prior Publication Data

US 2019/0139809 A1    May 9, 2019

(30) Foreign Application Priority Data

Nov. 8, 2017    (KR) ........................ 10-2017-0148288

(51) Int. Cl.
| | | |
|---|---|---|
| *H01L 21/687* | (2006.01) | |
| *H01L 21/68* | (2006.01) | |
| *H01L 21/677* | (2006.01) | |
| *G02F 1/13* | (2006.01) | |

(Continued)

(52) U.S. Cl.
CPC ...... *H01L 21/68742* (2013.01); *G02F 1/1303* (2013.01); *G03F 7/70716* (2013.01); *H01L 21/67724* (2013.01); *H01L 21/67745* (2013.01); *H01L 21/67784* (2013.01); *H01L 21/67787* (2013.01); *H01L 21/68* (2013.01); *H01L 21/6838* (2013.01); *H01L 21/68735* (2013.01);

(Continued)

(58) Field of Classification Search
None
See application file for complete search history.

(56) References Cited

U.S. PATENT DOCUMENTS

| | | |
|---|---|---|
| 6,381,002 B1 | 4/2002 | Suzuki |
| 6,867,534 B2 | 3/2005 | Tanaka |
| 7,106,082 B2 | 9/2006 | Yoshioka |

(Continued)

FOREIGN PATENT DOCUMENTS

| | | |
|---|---|---|
| EP | 1 538 452 B1 | 11/2006 |
| JP | 2013-046044 A | 3/2013 |

(Continued)

*Primary Examiner* — Michelle M Iacoletti
(74) *Attorney, Agent, or Firm* — Lee & Morse, P.C.

(57) ABSTRACT

A substrate supporting and transferring apparatus and associated methods, the apparatus including a shuttle configured to move in a x-direction and a y-direction, the y-direction being perpendicular to the x-direction; a lower wedge block on the shuttle, the lower wedge block including a lower surface that is parallel with an upper surface of the shuttle and an upper surface that is inclined with respect to the lower surface of the lower wedge block; an upper wedge block on the lower wedge block, the upper wedge block including a lower surface that is parallel with the upper surface of the lower wedge block and an upper surface that is parallel with the upper surface of the shuttle; and a chuck on the upper wedge block, the chuck being configured to support a substrate.

17 Claims, 16 Drawing Sheets

(51) Int. Cl.
*H01L 21/683* (2006.01)
*G03F 7/20* (2006.01)

(52) U.S. Cl.
CPC .. *H01L 21/68764* (2013.01); *H01L 21/68778* (2013.01); *H01L 21/68785* (2013.01)

(56) References Cited

U.S. PATENT DOCUMENTS

| | | | |
|---|---|---|---|
| 2001/0013787 A1* | 8/2001 | Takekoshi | G01R 31/2887 324/754.11 |
| 2002/0180312 A1 | 12/2002 | Tanaka | |
| 2005/0127898 A1* | 6/2005 | Yoshioka | G01R 31/2887 324/750.22 |
| 2005/0151951 A1* | 7/2005 | Hill | G03F 7/70516 355/67 |
| 2008/0115614 A1 | 5/2008 | Dvir et al. | |
| 2013/0033123 A1 | 2/2013 | Kubota et al. | |
| 2016/0355927 A1 | 12/2016 | Weaver et al. | |
| 2017/0153186 A1 | 6/2017 | Jeanne et al. | |

FOREIGN PATENT DOCUMENTS

| | | |
|---|---|---|
| JP | 2013-214691 A | 10/2013 |
| KR | 10-2012-0124807 A | 11/2012 |
| KR | 10-1726744 B1 | 4/2017 |
| KR | 10-1739052 B1 | 6/2017 |

\* cited by examiner

SUBSTRATE SUPPORTING AND TRANSFERRING APPARATUS, METHOD OF SUPPORTING AND TRANSFERRING SUBSTRATE, AND MANUFACTURING METHOD OF DISPLAY APPARATUS USING THE SAME

CROSS-REFERENCE TO RELATED APPLICATION

Korean Patent Application No. 10-2017-0148288, filed on Nov. 8, 2017, in the Korean Intellectual Property Office, and entitled: "Substrate Supporting and Transferring Apparatus, Method of Supporting and Transferring Substrate, and Manufacturing Method of Display Apparatus Using the Same," is incorporated by reference herein in its entirety.

BACKGROUND

1. Field

Embodiments relate to a substrate supporting and transferring apparatus, a method of supporting and transferring a substrate, and a manufacturing method of a display apparatus using the substrate supporting and transferring apparatus.

2. Description of the Related Art

A substrate supporting and transferring apparatus for supporting and transferring a display panel may include a chuck for supporting the display panel and a mover for moving the chuck.

SUMMARY

The embodiments may be realized by providing a substrate supporting and transferring apparatus including a shuttle configured to move in a x-direction and a y-direction, the y-direction being perpendicular to the x-direction; a lower wedge block on the shuttle, the lower wedge block including a lower surface that is parallel with an upper surface of the shuttle and an upper surface that is inclined with respect to the lower surface of the lower wedge block; an upper wedge block on the lower wedge block, the upper wedge block including a lower surface that is parallel with the upper surface of the lower wedge block and an upper surface that is parallel with the upper surface of the shuttle; and a chuck on the upper wedge block, the chuck being configured to support a substrate.

The embodiments may be realized by providing a method of supporting and transferring a substrate, the method including a first pre-alignment step in which a chuck of a substrate supporting and transferring apparatus moves in an x-direction, a y-direction that is perpendicular to the x-direction, or a z-direction that is perpendicular to the x and y-directions, or rotates on a x-y plane that is formed by the x and y-directions, to load a first substrate having a first thickness; a first loading step in which the first substrate is loaded on the chuck of the substrate supporting and transferring apparatus; a first substrate supporting and moving step in which the chuck of the substrate supporting and transferring apparatus moves in the x, y, and z-directions, or rotates on the x-y plane to locate the first substrate on a process position for processing the first substrate; a first substrate unloading step in which the first substrate is unloaded by separating the first substrate from the chuck of the substrate supporting and transferring apparatus; a second pre-alignment step in which the chuck of the substrate supporting and transferring apparatus moves in the x-direction, the y-direction, or the z-direction, or rotates on the x-y plane to load a second substrate having a second thickness; a second substrate loading step in which the second substrate is loaded on the chuck of the substrate supporting and transferring apparatus; a second substrate supporting and moving step in which the chuck of the substrate supporting and transferring apparatus moves in the x, y, and z-directions, or rotates on the x-y plane to locate the second substrate on a process position for processing the second substrate; and a second substrate unloading step in which the second substrate is unloaded by separating the second substrate from the chuck of the substrate supporting and transferring apparatus.

The embodiments may be realized by providing a method of manufacturing a display apparatus, the method including a substrate providing step in which a substrate for manufacturing the display apparatus is provided and a photoresist layer is formed on the substrate; a substrate supporting and transferring step in which the substrate on which the photoresist layer is formed is transferred to an exposure position by a substrate supporting and transferring apparatus; and a display apparatus completing step in which a subsequent process is performed on the substrate on which the photoresist layer is formed to manufacture the display apparatus, and wherein the substrate supporting and transferring apparatus includes a shuttle configured to move in an x-direction and a y-direction, the y-direction being perpendicular to the x-direction; a lower wedge block on the shuttle, the lower wedge block including a lower surface that is parallel with an upper surface of the shuttle and an upper surface that is inclined with respect to the lower surface of the lower wedge block; an upper wedge block on the lower wedge block, the upper wedge block including a lower surface that is parallel with the upper surface of the lower wedge block and an upper surface that is parallel with the upper surface of the shuttle; and a chuck on the upper wedge block, the chuck being configured to support the substrate.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
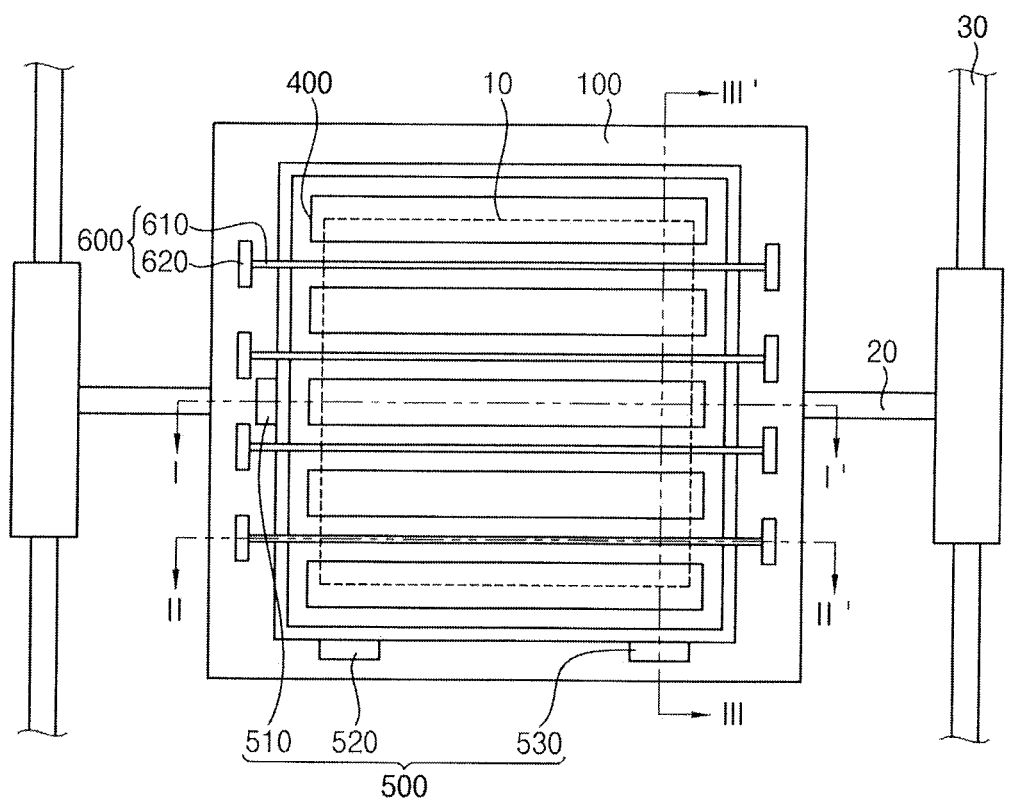
FIG. 1 illustrates a plan view of a substrate supporting and transferring apparatus in accordance with example embodiments.
Figure 2:
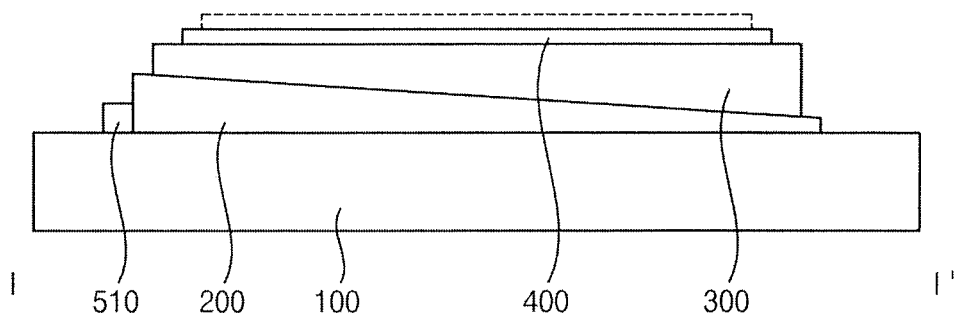
FIG. 2 illustrates a cross-sectional view of a shuttle, a lower edge block, an upper edge block and a chuck of the substrate supporting and transferring apparatus taken along line I-I' of FIG. 2.
Figure 3:
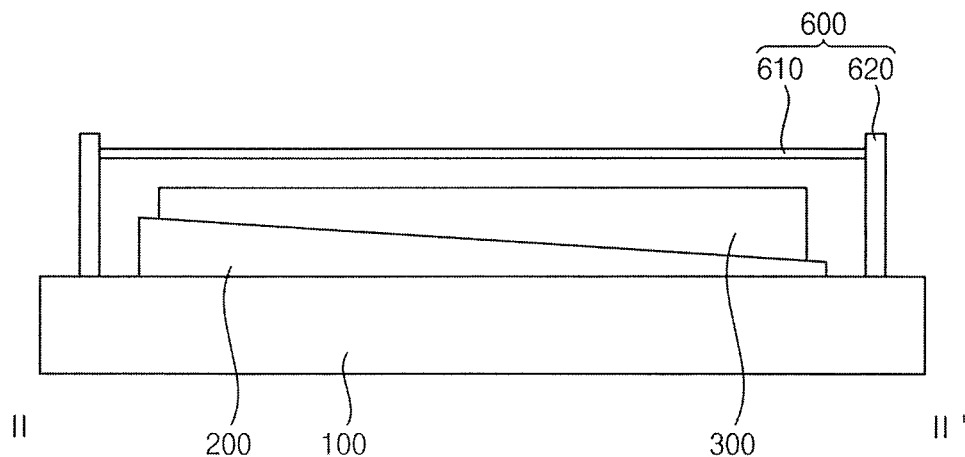
FIG. 3 illustrates a cross-sectional view of the shuttle, the lower wedge block, the upper wedge block, and a lifter of the substrate supporting and transferring apparatus taken along line II-II' of FIG. 1.
Figure 4:
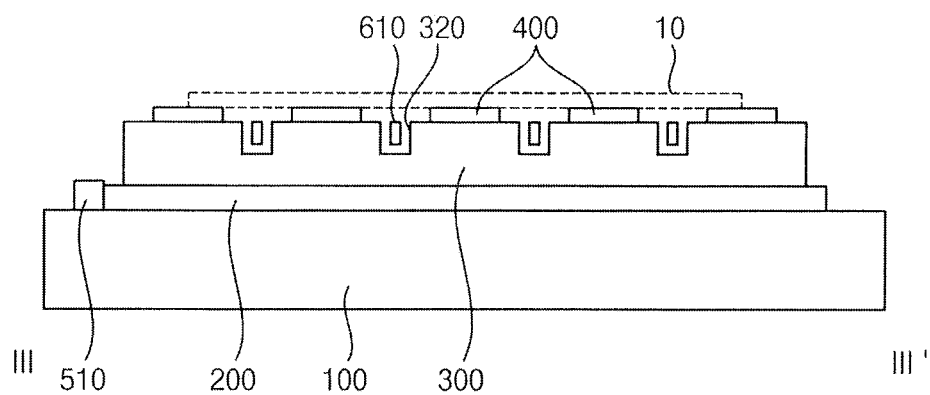
FIG. 4 illustrates a cross-sectional view of the shuttle, the lower wedge block, the upper wedge block, the chuck, and the lifter of the substrate supporting and transferring apparatus taken along line III-III' of FIG.

FIG. 1 illustrates a plan view of a substrate supporting and transferring apparatus in accordance with example embodiments. FIG. 2 illustrates a cross-sectional view of a shuttle, a lower edge block, an upper edge block and a chuck of the substrate supporting and transferring apparatus taken along line I-I' of FIG. 2. FIG. 3 illustrates a cross-sectional view of the shuttle, the lower wedge block, the upper wedge block, and a lifter of the substrate supporting and transferring apparatus taken along line II-II' of FIG. 1. FIG. 4 illustrates a cross-sectional view of the shuttle, the lower wedge block, the upper wedge block, the chuck, and the lifter of the substrate supporting and transferring apparatus taken along line III-III' of FIG.

Referring to FIGS. 1 to 4, the substrate supporting and transferring apparatus may include an x-axis mover 20, a y-axis mover 30, a shuttle 100, a lower wedge block 200, an upper wedge block 300, a chuck 400, a rotator 500, and a lifter 600.

The shuttle 100 may be connected to the x-axis mover 20, and the x-axis mover 20 may be connected to the y-axis mover 30. The shuttle 100 may move on x-y plane formed by an x-direction and a y-direction (perpendicular to the x-direction) by the x-axis mover 20 and the y-axis mover 30. x The lower wedge block 200 may be disposed on the shuttle 100. A lower surface of the lower wedge block 200 may be in parallel with an upper surface of the shuttle 100, and an upper surface of the lower wedge block 200 may be inclined with respect to the lower surface of the lower wedge block 200. Thus, a cross section of the lower wedge block 200 cut parallel to a z-direction (which is perpendicular to the x-direction and the y-direction) may have a wedge shape.

A lower air pressure controller (e.g., lower spraying suctioner) may spray or provide (e.g., compressed) air toward the shuttle from the lower surface of the lower wedge block 200 or remove air (e.g., inhale, suction, or vacuum air) may be formed at the lower wedge block 200. Accordingly, the lower wedge block 200 may float (e.g., on a cushion of air) and move relative to the shuttle 100, or may be fixed in contact with the shuttle 100 (e.g., depending on whether air is provided or removed by the lower air pressure controller). A detailed description thereof will be provided below with reference to FIGS. 5A to 5C.

The upper wedge block 300 may be disposed on the lower wedge block 200. A lower surface of the upper wedge block 300 may be parallel with the upper surface of the lower wedge block 200, and an upper surface of the upper wedge block 300 may be inclined with respect to the lower surface of the upper wedge block 300. Thus, a cross section of the upper wedge block 300 cut parallel to the z-direction may have a wedge shape. (refer to FIG. 2)

An upper air pressure controller may provide air toward the lower wedge block 200 from the lower surface of the upper wedge block 300 or may remove air therefrom, and may be formed at the upper wedge block 300. Accordingly, the upper wedge block 300 may float (e.g., on a cushion of air) and move relative to the lower wedge block 200, or may be fixed in contact with the lower wedge block 200. A detailed description thereof will be provided below with reference to FIGS. 6A to 6D.

The upper wedge block 300 may be capable of relative motion only in one direction with respect to the lower wedge block 200. As shown in the drawing figures, the upper wedge block 300 may move with respect to the lower wedge block 200 only in the x-direction so that the upper wedge block 300 and the lower wedge block 200 cannot move relative to each other in the y-direction. For example, a guide extended in the x-direction may be formed at a portion where the upper wedge block 300 makes contact to the lower wedge block 200 to guide the upper wedge block 300 and the lower wedge block 200 to move only in the x-direction. In an implementation, the guide may be constructed so as not to restrict relative movement of the upper wedge block 300 and the lower wedge block 200 in the z-direction. (refers to FIGS. 5A, 5A, 6A and 6A, etc.)

As the upper wedge block 300 moves relative to the lower wedge block 200, the chuck 400 may move in the z-direction. In addition, the lower wedge block 200 may be rotated a predetermined angle on the x-y plane with respect to the shuttle 100 (refers to FIG. 6C). Accordingly, the chuck 400 supporting the substrate 10 can move in the x-direction, the y-direction, the z-direction and rotate at a predetermined angle on the x-y plane, so that the chuck 400 may support the substrate 10 and move the substrate 10 to a desired position.

The chuck 400 may be disposed on the upper wedge block 300. The chuck 400 may be for fixing the substrate 10. Various types of chucks may be used. For example, a vacuum chuck, an electrostatic chuck, a porous chuck, or the like may be used.

The chuck 400 may be divided into or include a plurality of parts that are spaced apart from each other. (refers to FIG. 1) This is for a space in which the lifter 600 is placed. Although relative position of the lifter 600 relative to the shuttle 100 may be changed by rotation of the lower wedge block 200, the upper wedge block 300, and the chuck 400 on the x-y plane (refers to FIG. 6C), interference between the chuck 400 and the lifter 600 may not occur because the plurality of parts of the chuck 400 is spaced apart from one another by sufficient spacing.

The substrate 10 may be seated on the chuck 400. Accordingly, the substrate supporting and transferring apparatus may support and transport the substrate 10 to a desired position. The substrate 10 may be a display substrate for manufacturing a display apparatus. Here, the substrate 10 may have various thicknesses depending on an object to be processed. In an implementation, the position of the chuck 400 in the z-direction, e.g., a height of the chuck may be be changed according to the relative movement of the lower wedge block 200 and the upper wedge block 300, and the substrate 10 may be moved to the desired position even if the thickness of the substrate 10 is changed.

The rotator 500 allows the lower wedge block 200 to be rotated a predetermined angle with respect to the x-y plane on the shuttle 100. The rotator 500 may include a first rotator 510 disposed on a first side (a left side in FIG. 1) of the lower wedge block 200, a second rotator 520 and a third rotator 530 disposed on a second side (a lower side in FIG. 1) that makes contact with the first side. Each of the first to third rotators 510, 520, and 530 may be a voice coil motor. A detailed description thereof will be provided with reference to FIG. 6C.

The lifter 600 may separate the substrate 10 from the chuck 400 or seat the substrate 10 on the chuck 400. The lifter 600 may include a lifting part or lifting arm 610 and a lifting driver 620. The lifting driver 620 may be installed on the shuttle 100, and may move the lifting arm 610 in the z-direction. The lifting arm 610 may have a bar shape extending in the x-direction and may be disposed between the plurality of parts of the chuck 400. As the lifting arm 610 is lifted up, the substrate 10 may be spaced from the chuck 400. A plurality of the lifting arms 610 may be disposed corresponding to the plurality of parts of the chuck 400. A detailed description of the lifter 600 will be described later with reference to FIGS. 7, 8A and 8B.

According to the present embodiment, the substrate supporting and transferring apparatus may move the chuck 400 supporting the substrate 10 in the x-direction, the y-direction, and the z-direction, or the chuck 400 may be rotated at a predetermined angle on the x-y plane, so that substrates of various sizes and thickness may be supported and moved to a desired position.

For example, when the size and thickness of the substrate 10 to be processed vary, in the case of a display panel for a display apparatus having different specifications for each model, it is possible to respond by changing the position of the chuck 400 appropriately without hardware changes of the substrate supporting and transferring apparatus.

In other substrate supporting and transferring apparatuses, a lifter or the like capable of moving the chuck in the z-direction may be provided on an upper part of the shuttle that can move on the x-y plane, so that the chuck may be moved in three dimensions. In this case, due to a structure of the lifter or the like, a center of gravity of the structure including the shuttle and the lifter may be higher than when the shuttle alone exists. Accordingly, when the shuttle moves, there may be a problem that the substrate which is transferring cannot be stably supported.

On the other hand, the substrate supporting and transferring apparatus according to an embodiment may have a lower center of gravity of a structure on the shuttle which are the lower wedge block, and the upper wedge block in the z-direction, as compared to the other substrate supporting and transferring apparatus. Thus, the substrate may be stably supported despite the movement of the shuttle on the x-y plane. Therefore, process efficiency may be improved.

For example, the substrate supporting and transferring apparatus may be suitable for supporting and transferring display panels for a plurality of display apparatus being larger than the wafer and having a different thickness and thickness.

Figure 5A:
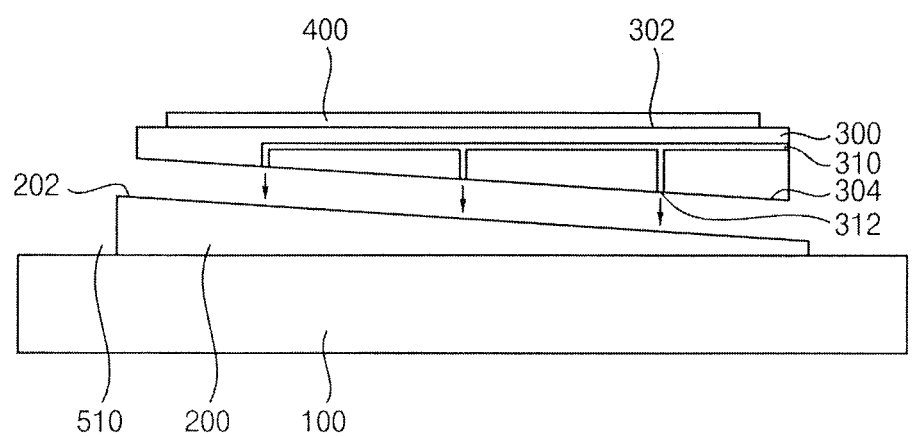
FIGS. 5A, 5B and 5C illustrate cross-sectional views of operation of the upper wedge block of the substrate supporting and transferring apparatus of FIG. 1.
Figure 5B:
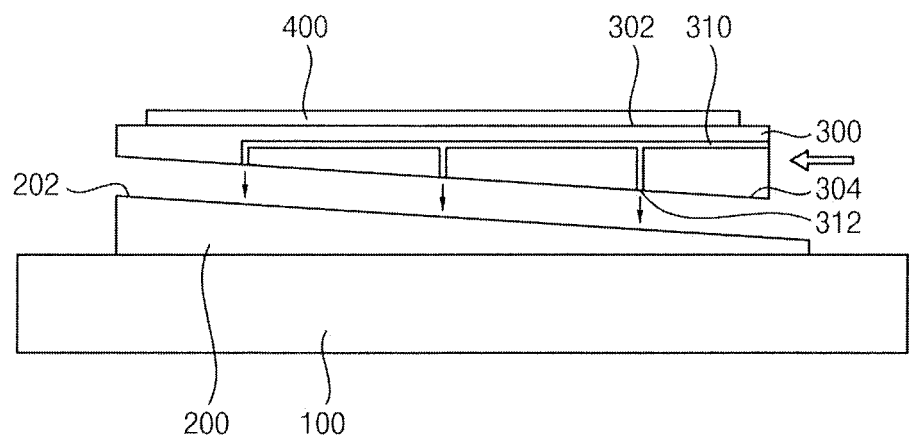
Figure 5B:
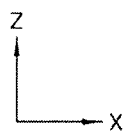
Figure 5C:
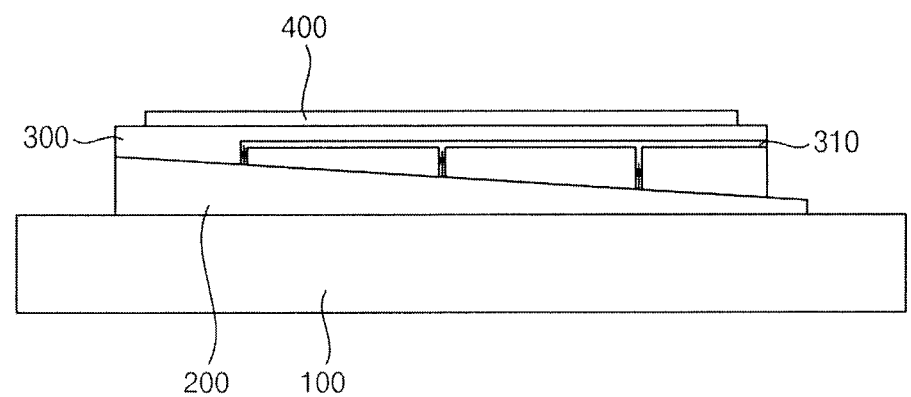
Figure 5C:
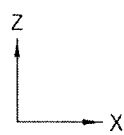
Figure 6A:
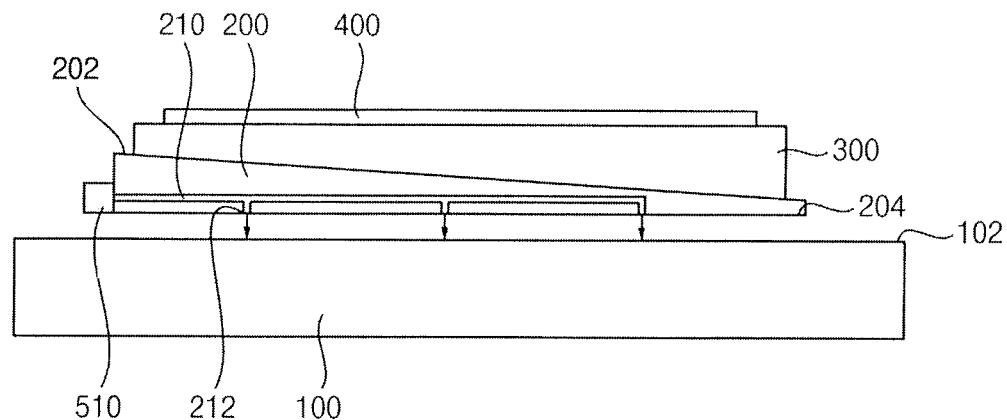
FIGS. 6A, 6B, 6C and 6D illustrate cross-sectional views and a plan view of operation of the lower wedge block of the substrate supporting and transferring apparatus of FIG. 1.
Figure 6B:
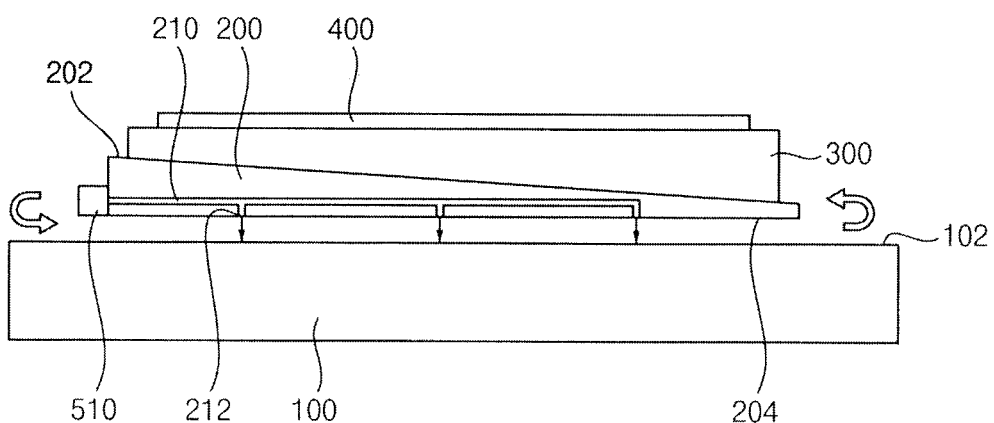
Figure 6C:
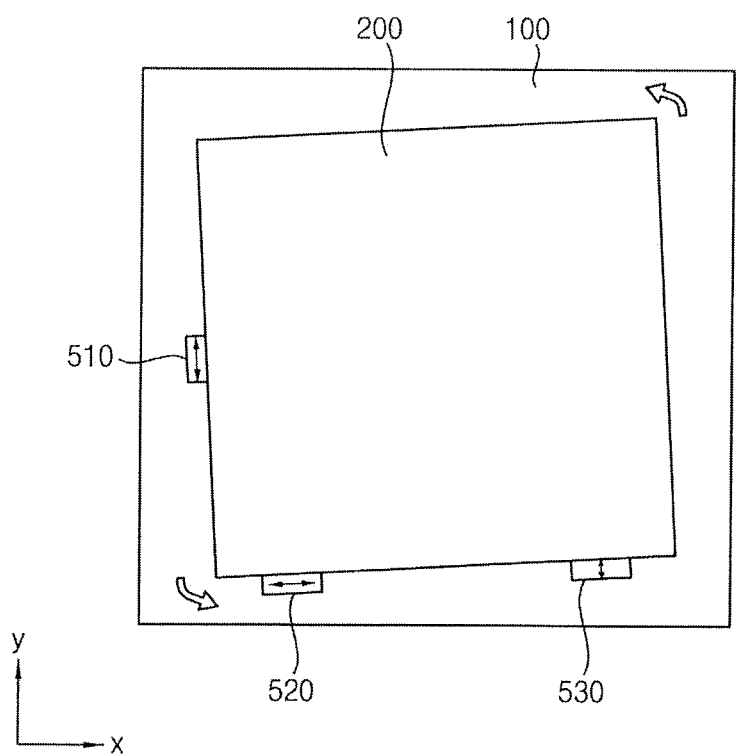
Figure 6D:
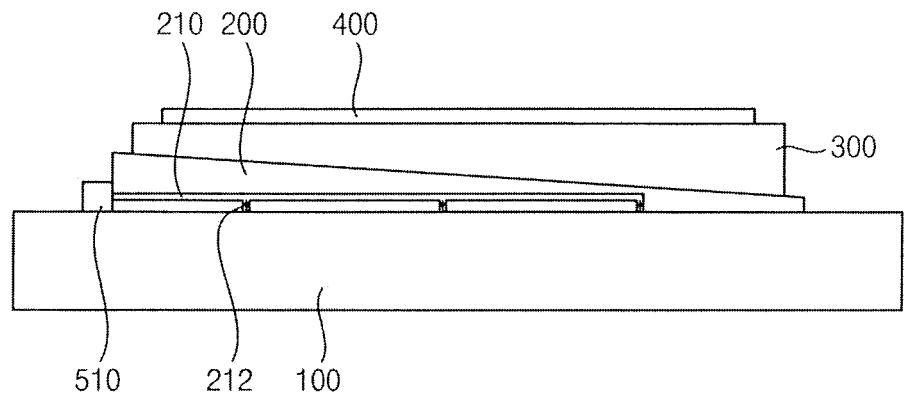
Figure 6D:
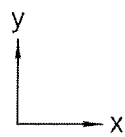

FIGS. 5A, 5B and 5C illustrate cross-sectional views of operations of the upper wedge block of the substrate supporting and transferring apparatus of FIG. 1.

Referring to FIGS. 5A to 5C, the substrate supporting and transferring apparatus may include an x-axis mover, a y-axis mover, a shuttle 100, a lower wedge block 200, an upper wedge block 300, a chuck 400, a rotator, and a lifter. To adjust a position of the chuck 400 in a z-direction, the upper wedge block 300 may be moved.

Referring to FIG. 5A, the upper wedge block 300 may include a second tube 310 and a plurality of second holes 312 (that are connected to the second tube 310) formed on a lower surface 304 of the upper wedge block 300. An air (e.g., compressed air) provider or air pump and vacuum provider or vacuum pump may be connected to the second tube 310. When air is supplied to the second tube 310 from the air provider, the air may be sprayed or provided from the second holes 312 by way of the second tube 310. Accordingly, the air may be sprayed from or provided at the lower surface 304 of the upper wedge block 300 to an upper surface 202 of the lower wedge block 200. Then, the upper wedge block 300 and the chuck 400 disposed on an upper surface 302 of the upper wedge block 300 may float (e.g., on a cushion of air) against the lower wedge block 200. For example, the upper wedge block 300 may include an upper air pressure controller.

Referring again to FIG. 5B, the upper wedge block 300 may move in parallel with a x-direction while the second holes 312 of the upper wedge block 300 sprays the air so that a position of the upper wedge block 300 in the z-direction can be changed. The lower surface 304 of the upper wedge block 300 and the upper surface 202 of the lower wedge block 200 may inclined with respect to a x-y plane formed by the x-direction and y-direction (refers to y in FIG. 1), and the position of the upper wedge block 300 in the z-direction may be changed while the upper wedge block 300 moves in parallel with the x-direction.

Here, the upper wedge block 300 may be moved only in a direction in parallel with the x-direction, and may be guided by a guide so as not to move, or be prevented from moving, in the y-direction. The guide may be provided to help restrict movement of the upper wedge block 300 in the y-direction and not to limit movement in the x-direction and the z-direction. In an implementation, a mover that moves the upper wedge block 300 may be further formed.

Referring to FIG. 5C, the upper wedge block 300 may be fixed on the lower wedge block 200, when the upper wedge block 300 moves to locate the chuck 400 to a desired position in the z-direction. When a vacuum is generated in the vacuum provider (e.g., when air is removed from between the upper wedge block 300 and the lower wedge block 200), the vacuum may be provided to the second holes 312 through the second tube 310 connected to the vacuum provider. A suction force may be generated between the lower surface 304 of the upper wedge block 300 and the upper surface 202 of the lower wedge block 200 so that the lower surface 304 of the upper wedge block 300 and the upper surface 202 of the lower wedge block 200 are attached to or pressed against each other. Thus, the upper wedge block 300 may be fixed on the lower wedge block 200.

In an implementation, the air and the vacuum may be provided to the lower surface 304 of the upper wedge block 300 through the second tube 310 and the second holes 312. In an implementation, the air and the vacuum may be provided to the lower surface 304 of the upper wedge block 300 by tubes and holes formed separately.

FIGS. 6A, 6B, 6C and 6D illustrate cross-sectional views and a plan view of operation of the lower wedge block of the substrate supporting and transferring apparatus of FIG. 1.

Referring to FIGS. 6A to 6D, the substrate supporting and transferring apparatus may include the substrate supporting and transferring apparatus may include an x-axis mover, a y-axis mover, a shuttle 100, a lower wedge block 200, an upper wedge block 300, a chuck 400, a rotator, and a lifter. To adjust an angle of the chuck 400 on x-y plane, the lower wedge block 200 may be rotated on the shuttle 100.

Referring again to FIG. 6A, the lower wedge block 200 may include a first tube 210 and a plurality of first holes 212 (connected to the first tube 210) on a lower surface 204 of the lower wedge block 200. An air provider and a vacuum provider may be connected to the first tube 210. When air is supplied to the first tube 210 from the air provider, the air may be sprayed from the first holes 212 by way of the first tube 210. Accordingly, air may be sprayed from the lower surface 204 of the lower wedge block 200 to an upper surface 102 of the shuttle 100. Then, the lower wedge block 200, the upper wedge block 300, and the chuck 400 may float against or over the shuttle 100. For example, the lower wedge block 200 may include a lower air pressure controller.

Referring again to FIGS. 6B and 6C, the rotator may include a first rotator 510, a second rotator 520, and a third rotator 530. The rotator may rotate the lower wedge block 200 on the x-y plane formed by the x-direction and the y-direction when the lower wedge block 200 floats against the shuttle 100. For example, each of the first to third rotators 510, 520, and 530 may be a voice coil motor. The first rotator 510 may move the lower wedge block 200 in the y-direction with respect to the shuttle 100. The second rotator 520 may move the lower wedge block 200 in the x-direction with respect to the shuttle 100. The third rotator 530 may move the lower wedge block 200 in the y-direction with respect to the shuttle 100.

While the first holes 212 of the lower wedge block 200 sprays the air, the first to third rotators 510, 520, and 530 may be appropriately operated so that the lower wedge block 200 may rotate on the x-y plane with respect to the shuttle 100. A degree to which the lower wedge block 200 is rotatable may be determined in view of interference with other configurations or components of the substrate supporting and transferring apparatus (e.g., the lifter 600). The substrate fixed to the chuck 400 may need to be slightly aligned and rotated only by a predetermined angle or less on the x-y plane, and an amount of rotability formed by the first to third rotators 510, 520 and 530 may be sufficient.

In an implementation, a guide that guides rotational movement of the lower wedge block 200 may be further formed between the lower wedge block 200 and the shuttle 100, e.g., between the upper wedge block 300 and the lower wedge block 200.

Referring again to FIG. 6D, when the lower wedge block 200 rotates and a rotating position of the chuck 400 on the x-y plane reaches to desired position, the upper wedge block 200 may be fixed on the shuttle 100. When the vacuum provider provides vacuum, the vacuum may be provided to the first holes 212 through the first tube 210 connected to the vacuum provider. Accordingly, a suction force may be generated between the lower surface 204 of the lower wedge block 200 and the upper surface 102 of the shuttle 100, so that the lower surface 204 of the lower wedge block 200 and the upper surface 102 of the shuttle 100 may be attached to or otherwise pressed against each other. Accordingly, the lower wedge block 200 may be fixed on the shuttle 100.

In an implementation, the air and the vacuum may be provided to the lower surface 204 of the lower wedge block 200 through the first tube 210 and the first holes 212. In an implementation, the air and the vacuum may be provided to the lower surface 204 of the lower wedge block 200 by separate tubes and holes.

In an implementation, the chuck 400 may move in the x-direction, the y-direction, and the z-direction, and may rotate on the x-y plane according to movement of the shuttle 100 in the x-direction and the y-direction, rotation of the lower wedge block 200, movement of the upper wedge block 300. Accordingly, the substrate supporting and transferring apparatus may support the substrate to be processed and may move it to a desired position. Even when a plurality of substrates having various thicknesses are processed, it is possible to easily process them using the substrate supporting and transferring apparatus.

In addition, the substrate supporting and transferring apparatus may be configured such that a center of gravity of structures above the shuttle 100, e.g., the lower wedge block 200, the upper wedge block 300, and the chuck 400, are located at a lower position in the z-direction, so that the substrate can be stably supported despite movement of the shuttle 100 on the x-y plane. As a result, process efficiency may be improved.

Figure 7:
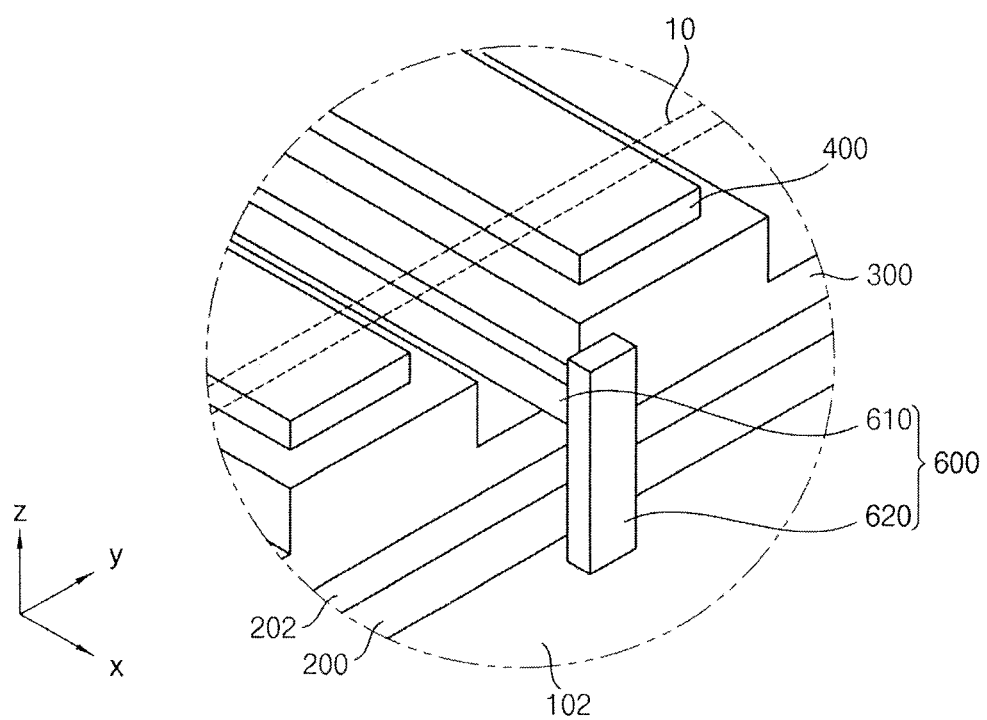
FIG. 7 illustrates a perspective view of a part of the lifter of the substrate supporting and transfer apparatus of FIG. 1.
Figure 8A:
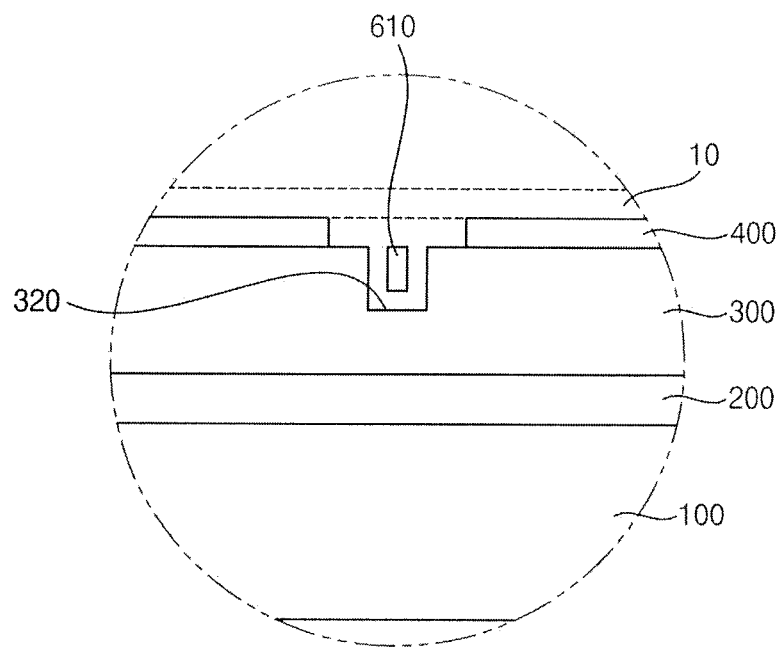
FIGS. 8A and 8B illustrate cross-sectional views of operation of the lifter of the substrate supporting and transferring apparatus of FIG. 7.
Figure 8B:
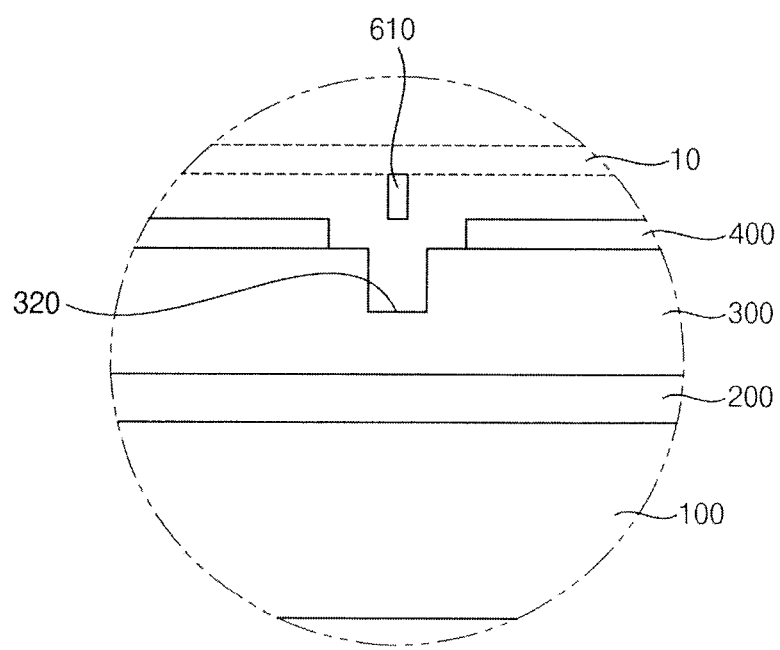

FIG. 7 illustrates a perspective view of a part of the lifter of the substrate supporting and transfer apparatus of FIG. 1. FIGS. 8A and 8B illustrate cross-sectional views illustrating operation of the lifter of the substrate supporting and transferring apparatus of FIG. 7.

Referring to FIGS. 7, 8A, and 8B, the substrate supporting and transferring apparatus may include a shuttle 100, a lower wedge block 200, an upper wedge block 300, a chuck 400, and a lifter 600. The lifter 600 may include a lifting arm 610 and a lifting driver 620.

The lifting arm 610 may extend in an x-direction, and a plurality of lifting arms may be disposed along the y-direction (perpendicular to the x-direction). The lifting arm 610 may be disposed in a trench 320 on an upper surface of the upper wedge block 300. Accordingly, the lifting arm 610 may be positioned at a lower position in the z-direction (perpendicular to the x and y-directions) than the upper surface of the chuck 400.

The lifting driver 620 may move the lifting arm 610 in the z-direction. When the lifting arm 610 moves in the z-direction by the lifting driver 620, the substrate 10 on the chuck 400 may be lifted by the lifting arm 610. Accordingly, the substrate 10 may be unloaded from the chuck 400. Conversely, the lifting driver 620 may be driven to load the substrate 10 onto the chuck 400. The lifting driver 620 may be disposed on an upper surface 102 of the shuttle 100. In addition, the lower wedge block 200, the upper wedge block 300, and the chuck 400 may be rotatable about the x-y plane on the shuttle 100, and the trench 320 of the upper wedge block 300 may have a sufficient width in the y-direction with respect to a size of the lifting arm 610.

Figure 9A:
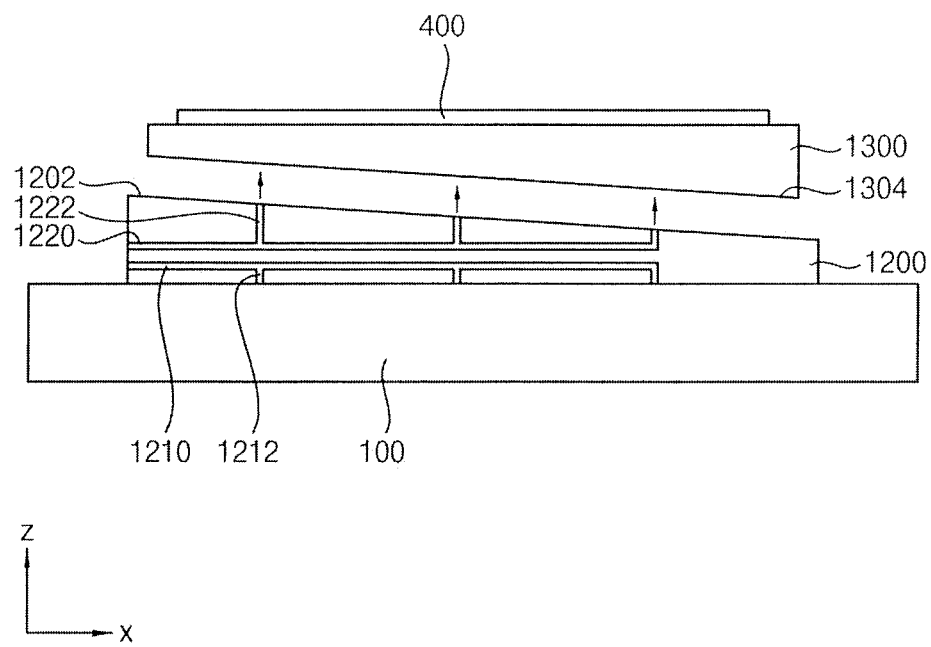
FIGS. 9A, 9B and 9C illustrate cross-sectional views of operation of an upper wedge block of a substrate supporting and transferring apparatus in accordance with example embodiments.
Figure 9B:
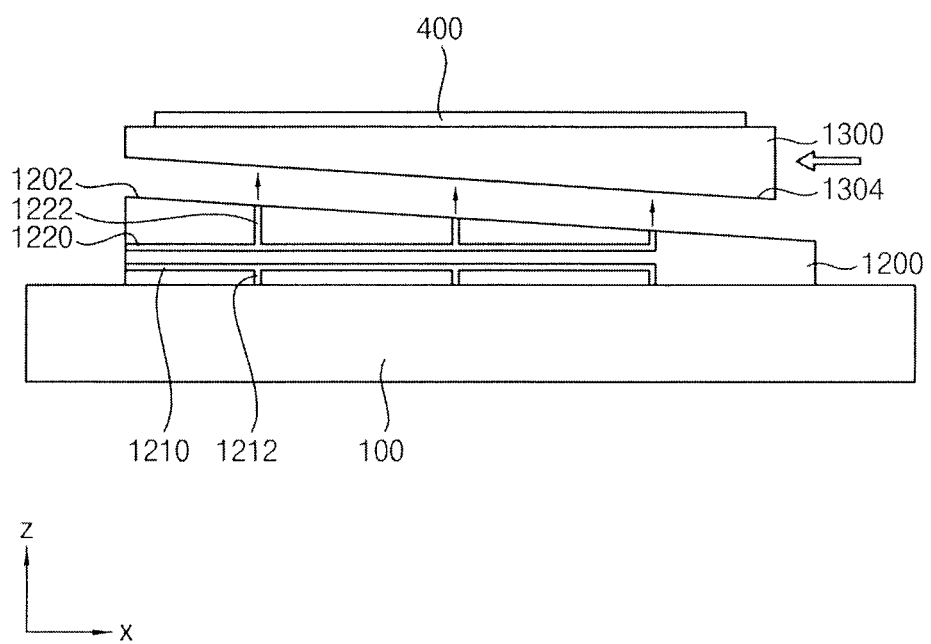
Figure 9C:
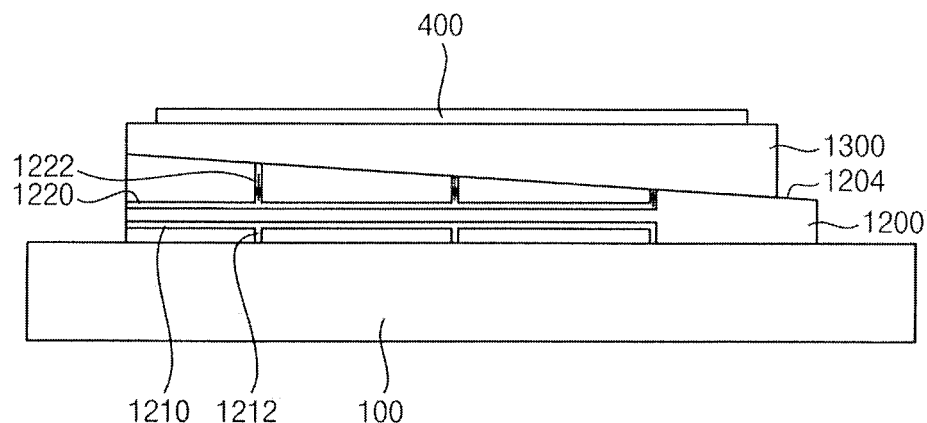

FIGS. 9A, 9B and 9C illustrate cross-sectional views of operation of an upper wedge block of a substrate supporting and transferring apparatus in accordance with example embodiments.

Referring to FIGS. 9A to 9C, the substrate supporting and transferring apparatus may be substantially same as the substrate supporting and transferring apparatus of FIGS. 1 to 4 except that all of a first tube 1210, a first hole 1212, a second tube 1220, and a second hole 1222 may be formed at or in a lower wedge block 1200. Therefore, a repeated description may be be omitted.

The substrate supporting and transferring apparatus may include x-axis mover, a y-axis mover, a shuttle 100, a lower wedge block 1200, an upper wedge block 1300, a chuck 400, a rotator, and a lifter.

Referring to FIG. 9A, the lower wedge block 1200 may include a second tube 1220 and a plurality of second holes 1222 on an upper surface 1202 of the lower wedge block 1200 and connected to the second tube 1220. An air provider and a vacuum provider may be connected to the second tube 1220. When air is supplied to the second tube 1220 from the air provider, the air may be sprayed from the second holes 1222 by way of the second tube 1220. Accordingly, the air may be sprayed from the upper surface 1202 of the lower wedge block 1200 toward a lower surface 1304 of the upper wedge block 1300. Then, the upper wedge block 1300 and the chuck 400 on an upper surface 1302 of the upper wedge block 1300 may float against the lower wedge block 1200.

Referring again to FIG. 9B, the upper wedge block 1300 may move in an x-direction while the second holes 1212 of the lower wedge block 1200 sprays the air so that a position of the upper wedge block 1300 in the z-direction may be changed. The lower surface 1304 of the upper wedge block 1300 and the upper surface 1202 of the lower wedge block 1200 may be inclined with respect to a x-y plane, and the position of the upper wedge block 1300 in the z-direction may be changed while the upper wedge block 1300 moves in the x-direction. Accordingly, the position of the chuck 400 on the upper surface 1302 of the upper wedge block 1300 in the z direction may be changed.

In an implementation, the upper wedge block 1300 may be moved only in the x-direction, and may be guided by a guide so as not to move in the y-direction. The guide may restrict movement of the upper wedge block 1300 in the y-direction and not to limit movement in the x-direction and the z-direction. In an implementation, a mover that moves the upper wedge block 1300 may be further formed.

Referring to FIG. 9C, the upper wedge block 1300 may be fixed on the lower wedge block 1200, when the upper wedge block 1300 moves to locate the chuck 400 to a desired position in the z-direction. When a vacuum is generated by the vacuum provider, the vacuum may be provided to the second holes 1222 by way of the second tube 1220 connected to the vacuum provider. A suction force may be generated between the upper surface 1202 of the lower wedge block 1200 and the lower surface 1304 of the upper wedge block 1300 so that the lower surface 1304 of the upper wedge block 300 and the upper surface 1202 of the lower wedge block 1200 are attached to each other. Thus, the upper wedge block 1300 may be fixed on the lower wedge block 1200.

In an implementation, the air and the vacuum may be provided to the upper surface 1202 of the lower wedge block 1200 through the second tube 1220 and the second holes 1222. In an implementation, the air and the vacuum may be provided to the upper surface 1202 of the lower wedge block 1200 by tubes and holes formed separately.

Figure 10A:
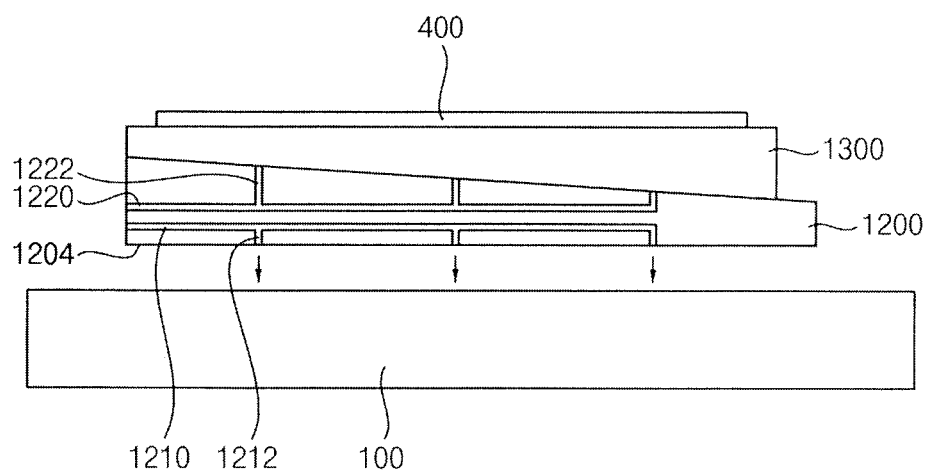
FIGS. 10A, 10B and 10C illustrate cross-sectional views of operation of a lower wedge block of the transfer and substrate support of FIGS. 9A to 9C.
Figure 10B:
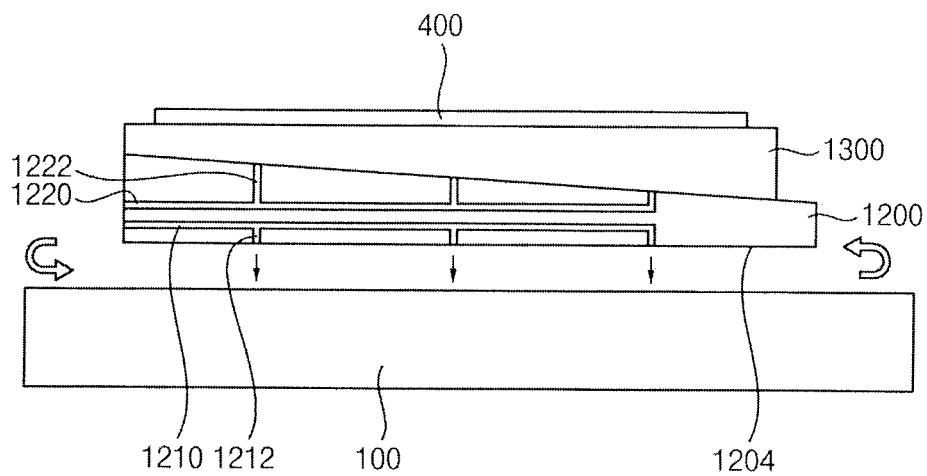
Figure 10C:
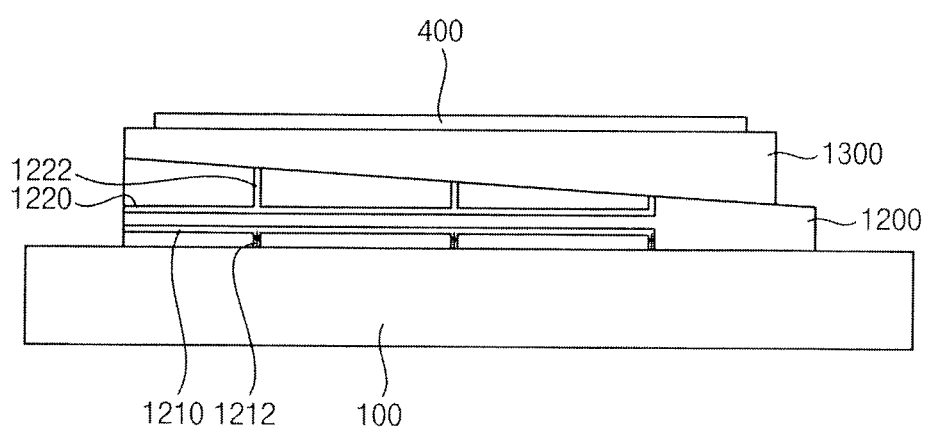

FIGS. 10A, 10B and 10C illustrate cross-sectional views of operation of a lower wedge block of the transfer and substrate support of FIGS. 9A to 9C.

Referring to FIGS. 10A to 10C, to adjust the angle on the x-y plane of the chuck 400, the lower wedge block 1200 may be rotated on the shuttle 100.

Referring again to FIG. 10A, the lower wedge block 1200 may include a first tube 1210 and a plurality of first holes 1212 on a lower surface 1204 of the lower wedge block 1200 and connected to the first tube 1210. An air provider and a vacuum provider may be connected to the first tube 1210. When air is supplied to the first tube 1210 from the air provider, the air may be sprayed from the first holes 1212 by way of the first tube 1210. Accordingly, the air may be sprayed from the lower surface 1204 of the lower wedge block 1200 to the upper surface 102 of the shuttle 100. Then, the lower wedge block 1200, the upper wedge block 1300 and the chuck 400 may float (e.g., on a cushion of air) against or over the shuttle 100.

Referring to FIG. 10B, the rotator may be configured to rotate the lower wedge block 1200 on the x-y plane with the lower wedge block 1200 floating against the shuttle 100.

While the first holes 1212 of the lower wedge block 1200 sprays the air, the lower wedge block 1200 may be rotated on the x-y plane with respect to the shuttle 100 by the rotator.

In an implementation, a guide that helps guide the rotational movement of the lower wedge block 1200 may be further formed between the lower wedge block 1200 and the shuttle 100, e.g., between the upper wedge block 300 and the lower wedge block 200.

Referring again to FIG. 10C, when the lower wedge block 1200 rotates and a rotating position of the chuck 400 on the x-y plane reaches a desired position, the upper wedge block 1200 may be fixed on the shuttle 100. When the vacuum provider provides a vacuum, the vacuum may be provided to the first holes 1212 by way of the first tube 1210 connected to the vacuum provider. Accordingly, a suction force may be generated between the lower surface 1204 of the lower wedge block 1200 and the upper surface 102 of the shuttle 100, so that the lower surface 1204 of the lower wedge block 1200 and the upper surface 102 of the shuttle 100 may be attached to each other. Accordingly, the lower wedge block 1200 may be fixed on the shuttle 100.

The substrate supporting and transferring apparatus of FIGS. 9A to 10C differs from the substrate supporting and transferring apparatus of FIGS. 1 to 5C in that the first and second holes 1212 and 1222 may be formed in the lower wedge block 1200, so that it can have a simpler structure.

Figure 11A:
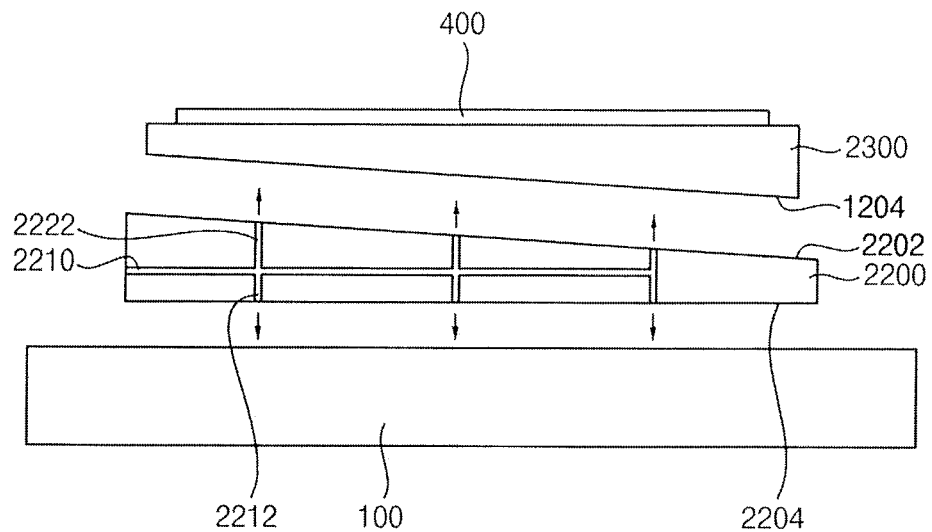
FIGS. 11A, 11B, and 11C illustrate cross-sectional views of operation of an upper wedge block and a lower wedge block of a substrate supporting and transferring apparatus in accordance with example embodiments.
Figure 11B:
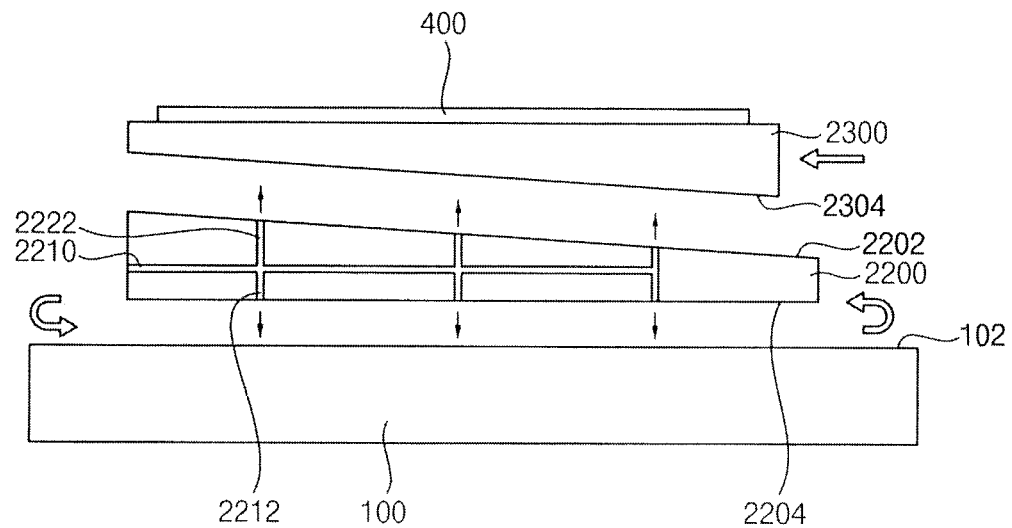
Figure 11C:
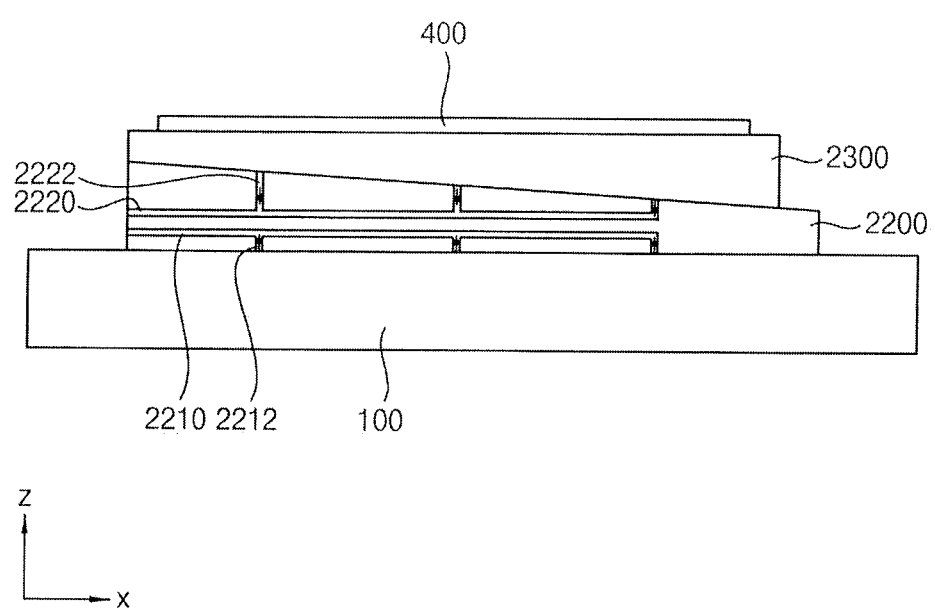

FIGS. 11A, 11B, and 11C are cross-sectional views illustrating operation of an upper wedge block and a lower wedge block of a substrate supporting and transferring apparatus in accordance with example embodiments.

Referring to FIG. 11A to 11C, the substrate supporting and transferring apparatus may be substantially same as the substrate supporting and transferring apparatus of FIGS. 9A to 9D and 10A to 10C, except that an upper wedge block 2300 and a lower wedge block 2200 may operate simultaneously. Therefore, a repeated description may be omitted.

The substrate supporting and transferring apparatus may include an x-axis mover, a y-axis mover, a shuttle 100, a lower wedge block 2200, an upper wedge block 2300, a chuck 400, a rotator, and a lifter.

The lower wedge block 2200 may include a first tube 2210, a plurality of first holes 2212 on a lower surface 2204 of the lower wedge block 1200 and connected to the first tube 2210, and a second holes 2222 on an upper surface 2202 of the lower wedge block 2200 and connected to the first tube 2210. An air provider and a vacuum provider may be connected to the first tube 2210.

Referring again to FIG. 11B, when air is supplied to the first tube 2210 from the air provider, the air may be sprayed from the first holes 2212 and the second holes 2222 by way of the first tube 2210. Accordingly, the air may be sprayed from the lower surface 2204 of the lower wedge block 2200 to an upper surface 102 of the shuttle 100, and the air may be sprayed from the upper surface 2202 of the lower wedge block 2200 to a lower surface 2304 of the upper wedge block 2300. Then, the lower wedge block 2200 may float against the shuttle 100, and the upper wedge block 2300 and the chuck 400 on the upper wedge block 2300 may float against the lower wedge block 2200.

Referring again to FIG. 11B, the upper wedge block 2300 may move in the x-direction while the first holes 2212 second holes 2222 of the lower wedge block 2200 sprays the air so that a position of the upper wedge block 2300 in the z-direction may be changed. At the same time, the rotator may rotate the lower wedge block 2200 on the x-y plane. Accordingly, it is possible to change the position in the z-direction and the angle on the x-y plane of the chuck 400 on the upper surface of the upper wedge block 2300.

Referring again to FIG. 11C, when the upper wedge block 2300 moves and the lower wedge block 2200 rotates to a desired position, the upper wedge block 2300 may be fixed on the upper wedge block 2200, and the upper wedge block 2200 may be fixed on the shuttle 100. When the vacuum provider provides vacuum, the vacuum may be provided to the first holes 2212 and the second holes 2222 through the first tube 2210 connected to the vacuum provider. Accordingly, a suction force may be generated between the upper surface 2202 of the lower wedge block 2200 and the lower surface 2304 of the upper wedge block 2300 and between the lower surface 2204 of the lower wedge block 2200 and the upper surface 102 of the shuttle 100, so that the lower surface 2304 of the upper wedge block 2300 and the upper surface 2202 of the lower wedge block 2200 may be attached to each other, and the lower surface 2204 of the lower wedge block 2200 and the upper surface 102 of the shuttle 100 may be attached to each other, Accordingly, the upper wedge block 2300 and the lower wedge block 2200 may be fixed on the shuttle 100.

In an implementation, the movement of the upper wedge block 2300 and the rotation movement of the lower wedge block 2200 may be simultaneously performed and the air and the vacuum may be provided through the first tube 2210 as one tube, so that the substrate supporting and transferring apparatus may have simple structure, and process efficiency can be improved.

Figure 12:
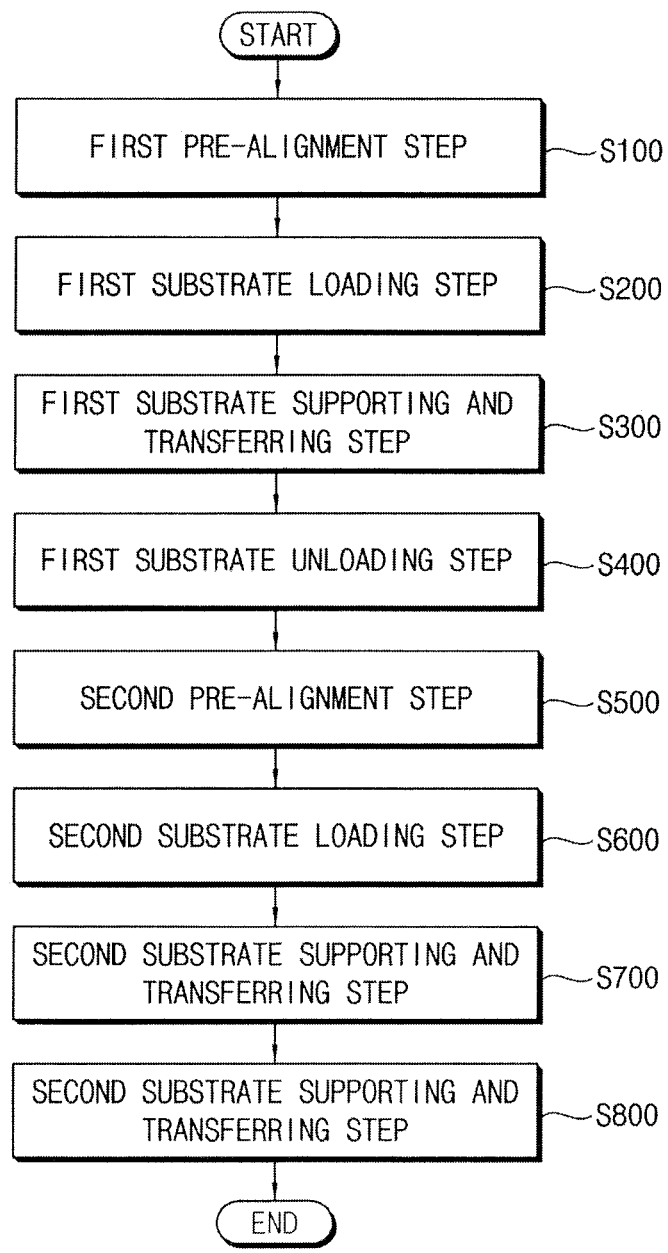
FIG. 12 illustrates a flow chart of a method of supporting and transferring a substrate in accordance with example embodiments.
Figure 13:
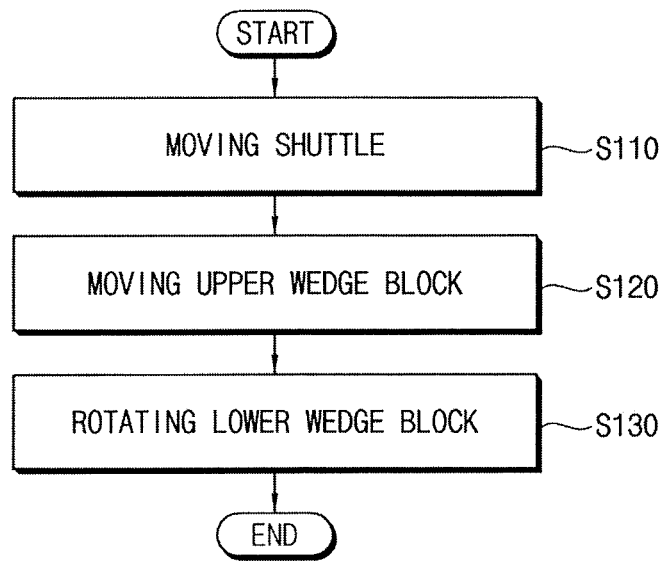
FIG. 13 illustrates a flow chart of a first pre-alignment step of the method of a substrate support and transfer of FIG. 12.
Figure 14:
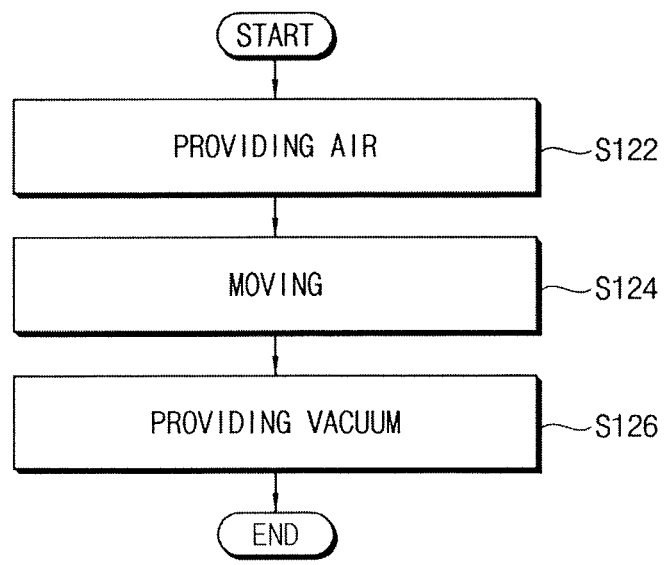
FIG. 14 illustrates a flow chart of an upper wedge block moving step of FIG. 13.
Figure 15:
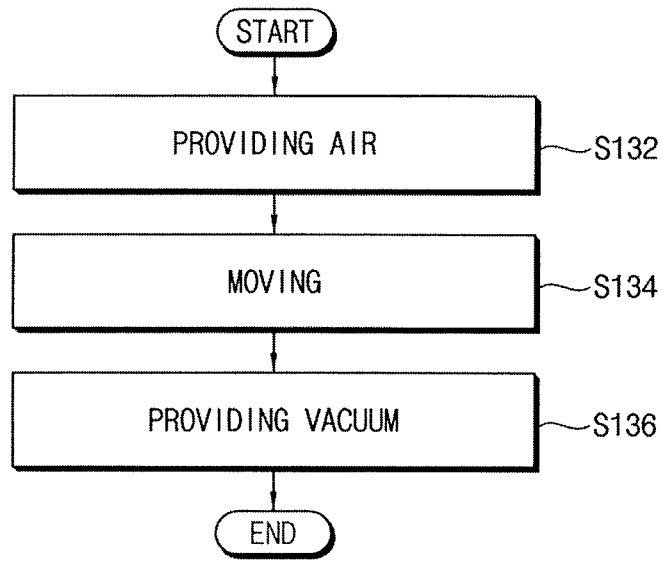
FIG. 15 illustrates a flow chart of a lower wedge block rotating step of FIG. 13.

FIG. 12 illustrates a flow chart of a method of supporting and transferring a substrate in accordance with example embodiments. FIG. 13 illustrates a flow chart of a first pre-alignment step of the method of a substrate support and transfer of FIG. 12. FIG. 14 illustrates a flow chart of an upper wedge block moving step of FIG. 13. FIG. 15 illustrates a flow chart of a lower wedge block rotating step of FIG. 13.

Referring to FIGS. 12 to 15, the method may include a first pre-alignment step (S100), a first substrate loading step (S200), a first substrate supporting and transferring step (S300), a first substrate unloading step (S400), a second pre-alignment step (S500), a second substrate loading step (S600), a second substrate supporting and transferring step (S700), and a second substrate unloading step (S800). The first pre-alignment step (S100) may include moving the shuttle (S110), moving the upper wedge block (S120), and rotating the lower wedge block (S130). The upper wedge block moving step (S120) may include providing air (S122), moving (S124), and providing a vacuum (S126). The lower wedge block rotating step (S130) may include providing air (S132), moving (S134), and providing a vacuum (S136).

In the first pre-alignment step (S100), a chuck of a substrate supporting and transferring apparatus may move in an x-direction, a y-direction (perpendicular to the x-direction) or z-direction (perpendicular to the x and y-directions), or may rotate on a x-y plane which is formed by the x and y-directions to load a first substrate having a first thickness.

In the first substrate loading step (S200), the first substrate may be loaded on the chuck of the substrate supporting and transferring apparatus In the first substrate supporting and transferring step (S300), the chuck of the substrate supporting and transferring apparatus may move in the x, y, and z-directions, or may rotate on the x-y plane to locate the first substrate on a process position for performing a required process.

In the first substrate unloading step (S400), the first substrate may be unloaded by separating the first substrate from the chuck of the substrate supporting and transferring apparatus.

In the second pre-alignment step (S500), the chuck of the substrate supporting and transferring apparatus may move in the x-direction, the y-direction, or the z-direction, or may rotate on the x-y plane to load a second substrate having a second thickness.

In the second substrate loading step (S600), the second substrate may be loaded on the chuck of the substrate supporting and transferring apparatus.

In the second substrate supporting and transferring step (S700), the chuck of the substrate supporting and transferring apparatus may move in the x, y, and z-directions, or may rotate on the x-y plane to locate the second substrate on a process position for processing the substrate.

In the second substrate unloading step (S800), the second substrate may be unloaded by separating the second substrate from the chuck of the substrate supporting and transferring apparatus.

Each of the first pre-alignment step, the first substrate supporting and transferring step, the second pre-alignment step and the second substrate supporting and transferring step may be performed as following steps. The substrate supporting and transferring apparatus may include a shuttle, an upper wedge block on the shuttle, an upper wedge block on the lower wedge block, and a chuck on the upper wedge block. The shuttle may move in the x and/or y-direction. The upper wedge block may move in the x-direction to move the chuck in the z-direction. The lower wedge block may rotate on the shuttle on the x-y plane.

In addition, the upper wedge block moving step may include an air providing step in which air is provided between the upper wedge block and the lower wedge block, a moving step in which the upper wedge block moves to move the chuck in the z-direction, and a vacuum providing step in which vacuum is provided between the upper wedge block and the lower wedge block to attach the upper wedge block and the lower wedge block each other.

In addition, the lower wedge block moving step may include an air providing step in which air is provided between the lower wedge block and the shuttle, a moving step in which the lower wedge block rotates to change an angle of the chuck on the x-y plane. and a vacuum providing step in which vacuum is provided between the lower wedge block and the shuttle to attach the upper wedge block and the lower wedge block each other.

According to the embodiments, the method for supporting and transferring a substrate can support and transfer substrates of various sizes and thicknesses to a desired location. Thus, the process efficiency can be improved.

Figure 16:
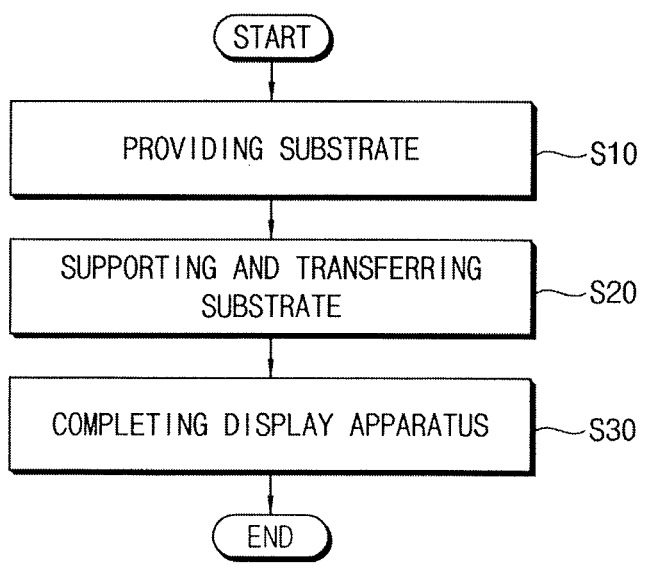
FIG. 16 illustrates a flow chart of a method of manufacturing a display apparatus in accordance with example embodiments.

FIG. 16 illustrates a flow chart of a method of manufacturing a display apparatus in accordance with example embodiments.

Referring to FIG. 16, the method may include providing a substrate (S10), supporting and transferring the substrate (S20), completing the display apparatus (S30).

In the substrate providing step (S10), a substrate for manufacturing the display apparatus may be provided, and a photoresist layer may be formed on the substrate.

In the substrate supporting and transferring step (S20), the substrate on which the photoresist layer is formed may be transferred to an exposure position by a substrate supporting and transferring apparatus according to embodiments.

In the display apparatus completing step (S30), a subsequent process may be performed on the substrate on which the photoresist layer is formed to manufacture the display apparatus. When the substrate is located at a proper position by the substrate supporting and transferring step (S20), the photoresist layer on the substrate may be exposed using an exposure apparatus, and then the subsequent steps may be performed to manufacture the display apparatus.

By way of summation and review, some substrate supporting and transferring apparatuses may be required to transfer the display panel to a desired position while firmly fixing the display panel. The mover may have a complicated structure so that there may be an issue in that the display panel may not be firmly supported.

In the substrate supporting and transferring apparatus and the method according to the exemplary embodiments, the substrate supporting and transferring apparatus may include a shuttle, a lower wedge block disposed on the shuttle, an upper wedge block disposed on the lower wedge block, and a chuck for supporting a substrate on the upper wedge block. The shuttle may move in the x and/or y directions, the upper wedge block may move in the x-direction, the lower wedge block may rotate on a x-y plane, so that the chuck may be moved to a desired position. Therefore, substrates of various thicknesses can be processed.

In addition, a center of gravity of the structures of the substrate supporting and transferring apparatus is lower than that of a traditional structure. Thus the substrate may be stably supported despite the movement of the chuck. Accordingly, the process efficiency may be improved.

The embodiments may provide a substrate supporting and transferring apparatus that can support and transport a substrate to a desired position.

The embodiments may provide a substrate supporting and transferring apparatus capable of handling substrates of various sizes and thicknesses.

The embodiments may provide a method of supporting and transferring a substrate capable of handling substrates of various sizes and thicknesses.

The embodiments may provide a method of manufacturing a display apparatus using the substrate supporting and transferring apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A substrate supporting and transferring apparatus, comprising:
    a shuttle configured to move in a x-direction and a y-direction, the y-direction being perpendicular to the x-direction;
    a lower wedge block on the shuttle, the lower wedge block including a lower surface that is parallel with an upper surface of the shuttle and an upper surface that is inclined with respect to the lower surface of the lower wedge block;
    an upper wedge block on the lower wedge block, the upper wedge block including a lower surface that is parallel with the upper surface of the lower wedge block and an upper surface that is parallel with the upper surface of the shuttle;
    a chuck on the upper wedge block, the chuck being configured to support a substrate; and
    an upper air pressure controller that is configured to provide air between the lower wedge block and the upper wedge block and to remove air from between the lower wedge block and the upper wedge block.

2. The substrate supporting and transferring apparatus as claimed in claim 1, wherein:
    the upper air pressure controller is on the lower surface of the upper wedge block, and
    the upper air pressure controller includes a plurality of second holes that provides air onto and removes air from the upper surface of the lower wedge block.

3. The substrate supporting and transferring apparatus as claimed in claim 2, further comprising a lower air pressure controller that is configured to provide air between the lower wedge block and the shuttle and to remove air from between the lower wedge block and the shuttle,
    wherein:
        the lower air pressure controller is on the lower surface of the lower wedge block, and
        the lower air pressure controller includes a plurality of first holes that provides air onto and removes air from the upper surface of the shuttle.

4. The substrate supporting and transferring apparatus as claimed in claim 1, further comprising a lower air pressure controller that is configured to provide air between the lower wedge block and the shuttle and to remove air from between the lower wedge block and the shuttle.

5. The substrate supporting and transferring apparatus as claimed in claim 4, wherein:
    the upper air pressure controller and the lower air pressure controller include a first tube in the lower wedge block and a plurality of first holes connected to the first tube and a plurality of and second holes connected to the first tube,
    the first holes are on the lower surface of the lower wedge block, and
    the second holes are on the upper surface of the lower wedge block.

6. The substrate supporting and transferring apparatus as claimed in claim 4, further comprising a rotator configured to rotate the lower wedge block at a predetermined angle with respect to an x-y plane on the shuttle, wherein the x-y plane is formed by the x-direction and the y-direction.

7. The substrate supporting and transferring apparatus as claimed in claim 1, further comprising:
    a mover configured to move the upper wedge block in the x-direction so that a position of the upper wedge block in a z-direction is changed, the z-direction being perpendicular to the x-direction and the y-direction; and a guide configured to guide the upper wedge block in the x-direction so as to prevent movement in the y-direction.

8. The substrate supporting and transferring apparatus as claimed in claim 1, further comprising:
a lifting arm configured to load and unload the substrate on the chuck, and
a lifting driver on the shuttle, the lifting driver being configured to move the lifting arm.

9. A method of supporting and transferring a substrate, the method comprising:
a first pre-alignment step in which a chuck of a substrate supporting and transferring apparatus moves in an x-direction, a y-direction that is perpendicular to the x-direction, or a z-direction that is perpendicular to the x and y-directions, or rotates on a x-y plane that is formed by the x and y-directions, to load a first substrate having a first thickness;
a first loading step in which the first substrate is loaded on the chuck of the substrate supporting and transferring apparatus;
a first substrate supporting and moving step in which the chuck of the substrate supporting and transferring apparatus moves in the x, y, and z-directions, or rotates on the x-y plane to locate the first substrate on a process position for processing the first substrate;
a first substrate unloading step in which the first substrate is unloaded by separating the first substrate from the chuck of the substrate supporting and transferring apparatus;
a second pre-alignment step in which the chuck of the substrate supporting and transferring apparatus moves in the x-direction, the y-direction, or the z-direction, or rotates on the x-y plane to load a second substrate having a second thickness;
a second substrate loading step in which the second substrate is loaded on the chuck of the substrate supporting and transferring apparatus;
a second substrate supporting and moving step in which the chuck of the substrate supporting and transferring apparatus moves in the x, y, and z-directions, or rotates on the x-y plane to locate the second substrate on a process position for processing the second substrate; and
a second substrate unloading step in which the second substrate is unloaded by separating the second substrate from the chuck of the substrate supporting and transferring apparatus,
wherein:
the substrate supporting and transferring apparatus includes a shuttle, a lower wedge block on the shuttle, an upper wedge block on the lower wedge block, and the chuck on the upper wedge block, and
each of the first pre-alignment step, the first substrate supporting and moving step, the second pre-alignment step and the second substrate supporting and moving step includes:
a shuttle moving step in which the shuttle moves in the x-direction or y-direction;
an upper wedge block moving step in which the upper wedge block moves in the x-direction to move the chuck in the z-direction; and
a lower wedge block rotating step in which the lower wedge block rotates on the shuttle on the x-y plane.

10. The method as claimed in claim 9, wherein the upper wedge block moving step includes:
an air providing step in which air is provided between the upper wedge block and the lower wedge block;
a moving step in which the upper wedge block moves to move the chuck in the z-direction; and
a vacuum providing step in which vacuum is provided between the upper wedge block and the lower wedge block to remove the air and attach the upper wedge block and the lower wedge block each other.

11. The method as claimed in claim 9, wherein the lower wedge block moving step includes:
an air providing step in which air is provided between the lower wedge block and the shuttle;
a moving step in which the lower wedge block rotates to change an angle of the chuck on the x-y plane; and
a vacuum providing step in which vacuum is provided between the lower wedge block and the shuttle to remove the air and attach the upper wedge block and the lower wedge block each other.

12. The method as claimed in claim 9, wherein the upper wedge block moving step and the lower wedge block moving step are simultaneously performed.

13. The method as claimed in claim 9, wherein the substrate supporting and transferring apparatus includes:
a shuttle configured to move in an x-direction and y-direction, the y-direction being perpendicular to the x-direction;
a lower wedge block on the shuttle, the lower wedge block including a lower surface that is parallel with an upper surface of the shuttle and an upper surface that is inclined with respect to the lower surface of the lower wedge block;
an upper wedge block on the lower wedge block, the upper wedge block including a lower surface that is parallel with the upper surface of the lower wedge block and an upper surface that parallel with the upper surface of the shuttle; and
the chuck on the upper wedge block.

14. The method as claimed in claim 13, wherein the substrate supporting and transferring apparatus further includes an air pressure controller that provides air between the lower wedge block and the upper wedge block or between the lower wedge block and the shuttle and removes air from between the lower wedge block and the upper wedge block or between the lower wedge block and the shuttle.

15. The method as claimed in claim 14, wherein:
in the upper wedge block moving step, the air is provided between the upper wedge block and the lower wedge block to float the upper wedge block, and the floated upper wedge block moves along the upper surface of the lower wedge block that is inclined to move the chuck in the z-direction, and
the air between the upper wedge block and the lower wedge block is removed to fix the upper wedge block to the lower wedge block.

16. The method as claimed in claim 15, wherein:
the substrate supporting and transferring apparatus further includes a rotator configured to rotate the lower wedge block at a predetermined angle with respect to x-y plane on the shuttle, the x-y plane being formed by the x-direction and the y-direction, and
in the lower wedge block rotating step, the air is provided between the lower wedge block and the shuttle to float lower wedge block, and the floated lower wedge block rotates on the shuttle on the x-y plane, and
the air between the lower wedge block and the shuttle is removed to fix the lower wedge block to the shuttle.

17. A method of manufacturing a display apparatus, the method comprising:
- a substrate providing step in which a substrate for manufacturing the display apparatus is provided and a photoresist layer is formed on the substrate;
- a substrate supporting and transferring step in which the substrate on which the photoresist layer is formed is transferred to an exposure position by a substrate supporting and transferring apparatus; and
- a display apparatus completing step in which a subsequent process is performed on the substrate on which the photoresist layer is formed to manufacture the display apparatus, and
- wherein the substrate supporting and transferring apparatus includes:
- a shuttle configured to move in an x-direction and a y-direction, the y-direction being perpendicular to the x-direction;
- a lower wedge block on the shuttle, the lower wedge block including a lower surface that is parallel with an upper surface of the shuttle and an upper surface that is inclined with respect to the lower surface of the lower wedge block;
- an upper wedge block on the lower wedge block, the upper wedge block including a lower surface that is parallel with the upper surface of the lower wedge block and an upper surface that is parallel with the upper surface of the shuttle; and
- a chuck on the upper wedge block, the chuck being configured to support the substrate, and
- wherein the substrate supporting and transferring step includes:
- a shuttle moving step in which the shuttle moves in the x-direction or y-direction;
- an upper wedge block moving step in which the upper wedge block moves in the x-direction to move the chuck in a z-direction, the z-direction being perpendicular to the x-direction and the y-direction; and
- a lower wedge block rotating step in which the lower wedge block rotates on the shuttle on the x-y plane.

* * * * *